United States Patent
Liaw et al.

(10) Patent No.: US 6,909,187 B2
(45) Date of Patent: Jun. 21, 2005

(54) CONDUCTIVE WIRING LAYER STRUCTURE

(75) Inventors: Yuangtsang Liaw, Taichung (TW); Hung-Yin Tsai, Taipei Hsien (TW); Kenny Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 591 days.

(21) Appl. No.: 10/063,630

(22) Filed: May 6, 2002

(65) Prior Publication Data

US 2002/0170742 A1 Nov. 21, 2002

(51) Int. Cl.⁷ ............................................. H01L 23/48
(52) U.S. Cl. ....................... 257/758; 257/211; 257/700; 257/759; 257/760; 257/776; 257/786
(58) Field of Search ................................. 257/210, 459, 257/676, 786, 700, 701, 703–707, 758–760

(56) References Cited

U.S. PATENT DOCUMENTS 5,760,429 A * 6/1998 Yano et al. ................. 257/211
5,998,872 A * 12/1999 Kim et al. ................... 257/758

* cited by examiner

Primary Examiner—Andy Huynh
(74) Attorney, Agent, or Firm—Jianq Chyun IP Office

(57) ABSTRACT

A conductive wiring layer structure, applied to the conductive wiring layer structure under bonding pads of a die. The die has a substrate and can be partitioned into a central core circuit and a peripheral bonding pad area. The conductive wire layer structure has a plurality of trapezium conductive wiring regions and a plurality of inverse trapezium conductive wiring regions alternately arranged in the bonding pad area. Each of the equilateral and inverse trapezium conductive wiring regions has a plurality of dielectric layers and a plurality of conductive wiring layers alternately overlaying each other on the substrate. The conductive wiring layers of the trapezium conductive wiring region are wider as approaching the substrate, and become narrower as distant away from the substrate. The conductive wiring layers of the inverse trapezium conductive wiring region are narrower as approaching the substrate, and wider as distant away from the substrate.

8 Claims, 4 Drawing Sheets

CONDUCTIVE WIRING LAYER STRUCTURE

CROSS REFERENCE TO RELATED APPLICATIONS

This application claims the priority benefit of Taiwan application serial no. 90111530, filed on May 15, 2001.

BACKGROUND OF INVENTION

1. Field of the Invention

The invention relates in general to a structure of a conductive wiring layer. More particularly, the invention relates to a structure of a conductive wiring layer under bonding pads of a chip.

2. Description of the Related Art

Recently, semiconductors have been widely applied as the flourish development of electronic industry. The booming electronic industry thus evokes a fast growth of semiconductor fabrication technique. The semiconductor fabrication process can be divided into a front-end process and a back-end process. In the front-end process, the semiconductor substrate and the semiconductor device are formed. That is, the front-end process involves single crystal and epitaxy growing technique, and MOS and interconnection fabrication techniques. The back-end process basically includes the package process. The objective of package is to prevent the die from being affected by the moisture, heat and noise. The package further provides the signal connection between the die and the substrate to facilitate functioning and testing. The wire bonding process in the package process is to bond each electrical contact, that is, a bonding pad on the chip, to a terminal of the carrier with a very fine gold wire. Thereby, the electric signal of the integrated circuit is transmitted to external.

In the wire bonding process, the welding has to be enhanced with ultra-sonic vibration, such that the area under the bonding pad is experienced a very large impact to cause breakage or fracture of the fragile dielectric layers between metal layers. The disconnected neighboring conductive wiring layers are thus abnormally connected together due to the formation of undesired contact or electrical open. The abnormal electrical connection is not allowed in the original circuit design. That is, the abnormal electrical connection destructs the original circuit design to cause the chip failure, and to waste the fabrication cost.

In addition to the input/output signal contacts, the power contacts and ground contacts are crucial to a semiconductor chip. The power contact is used as a current input terminal to provide the current required for the operations of circuit devices in the chip. The current is grounded in external via the ground contact. Therefore, the traces connected to the power contact and the ground contact should have a total cross sectional area sufficiently large to allow the required current to flow through. If a massive amount of current is flowing through a conductive wire with insufficient cross sectional area, the metal conductive wiring layer will be blown to damage the chip. Therefore, the power and ground traces require a larger cross sectional area. As the conductive wiring layer in the semiconductor chip is made of thin film with a constant thickness, the cross sectional area thereof can be increased by way of increasing the width of the conductive wiring layer.

FIG. 1 and FIG. 2 show a top view and a side view of a chip and a part of carrier. The chip 10 comprises a core circuit 12 and a peripheral bonding pad area 14. The bonding pad area 14 comprises a plurality of bond pads 16, which are formed by the exposed openings on the uppermost conductive wiring layer (not shown). The bonding pads 16 are connected to the power ring 24, the ground ring 22 and the finger contact 26 of the carrier 20 by bonding wires 30. The allocation of the bonding pads 16 is shown as the first row 41 and the second row 42 of the bonding pads.

In FIG. 3, an enlarged view of the boundary between the core circuit and the bonding pad area is shown. In FIG. 4, a cross-sectional view cutting along the line I—I of FIG. 3 is illustrated. The chip 10 has a layer of substrate 18. A conventional conductive wiring layer structure 100 is located on the substrate 18. The conductive wiring layer structure 100 is formed by alternately overlaying three conductive wiring layers 110, 130 and 150 with three dielectric layers 120, 140 and 160. In this structure, an insulating layer 40 is formed on the uppermost conductive wiring layer 102.

On the conductive wiring layer structure 100, a part of the insulation layer 40 is removed to form a plurality of openings (that is, the bonding pads 16) above the conductive wiring layer 112 to provide contacts for external electric connections. The bonding wires 30 include the gold wires 32 and the gold balls 34. In the wiring bonding process, the bonding machine bonds the wires 30 on the bonding pads 16 of the chip 16 to form gold balls 34 and to pull out the gold wires 32, which selectively connect with the ground ring 22, the power ring 24 and the finger contact 26 as shown in FIG. 1. The surface area of the bonding pads 16 is larger than the effective area of the gold balls 34 to avoid the contact between the gold balls 34 and the insulation layer 40.

However, in the conventional conductive wiring structure 100, due to a great impact pressure caused by wiring bonding, the dashed line part of the fragile dielectric layers 120, 140 and 160 are easily damaged and fractured to cause a deformation among the metal conductive wiring layers 110, 130 and 150. As a result, abnormal contacts are formed between these metal conductive wiring layers 110, 130 and 150 to cause abnormal electric connection. The original circuit design of the chip 10 is thus failed.

FIG. 5 is a simplified drawing of FIG. 4. In FIG. 5, only the conductive wiring layer 100 is shown. The conductive wiring layer is divided into a wide conductive wiring region 101 and a narrow conductive wiring region 102 according to the width of the conductive wire. The power trace requires a larger cross section to carry sufficient current, so as to avoid the metal conductive wiring layer to from blowing out. Referring to FIGS. 1 and 2, according to the requirement of design, the bonding pads 16 to connect the power source located near the ground ring 22. Referring to FIG. 3, the bonding pads 16 in the lower part are restricted to trace through the narrow conductive wiring region 102. Such conductive wires have insufficient width. As shown in FIG. 5, even vias are formed for connecting multi-layers of the traces to increase the total trace width, the total width is neither sufficient. For example, assume that the width of each conductive trace in the narrow conductive wiring region 102 is 20 units, and the required total width is 100 units, 60 units is obtained by adding the widths for three conductive wires. It is still insufficient. Therefore, while the current flows through, an overheat phenomenon to blow out the conductive trace is still possible.

According to the above, the conventional conductive wiring structure under the bonding pad of a chip has the following disadvantages:

(1) The prior art cannot provide sufficiently width of conductive wires for the power and ground bond pads of the chip. Therefore, the conductive wiring layer is easily blown out.

(2) During the wire bonding process, the bonding process causes a great impact to break or crash the dielectric layers under the bonding pad, so that undesired electric contacts are formed due to the extrusion of conductive wires.

SUMMARY OF INVENTION

The invention provides a conductive wiring layer structure under a bonding pad of a chip. The chip comprises a substrate. The chip is divided into a central core circuit and a bonding pad area circumscribing the central core circuit on the substrate. An insulation layer is formed to cover the central core circuit and the bonding pad area. The conductive wiring structure comprises a plurality of trapezium conductive wiring regions and a plurality of inverse trapezium conductive wiring regions alternately arranged in the bonding pad area. Each of the equilateral and inverse trapezium conductive wiring regions has a plurality of dielectric layers and a plurality of conductive wiring layers alternately overlaying each other on the substrate. The conductive wiring layers of the trapezium conductive wiring region are wider as approaching the substrate, and become narrower as distant away from the substrate. The conductive wiring layers of the inverse trapezium conductive wiring region are narrower as approaching the substrate, and wider as distant away from the substrate. The conductive wiring layers are electrically connected by conductive vias, which are made of tungsten, titanium, tantalum, platinum or molybdenum. The material of the conductive wiring layers includes copper, nickel, silver, palladium, palladium-nickel alloy, gold, titanium, titanium oxide or a combination of the above materials.

The invention change the conductive wiring layer structure under the bonding pad of the chip to reinforce the conductive wiring layer structure and to provide a larger width conductive wire. Therefore, the dielectric layer is not easily damage or broken due to the wiring bonding impact. In addition, a sufficiently large cross sectional area to conduct the power and ground conductive wires at the outer bonding pads is obtained.

Both the foregoing general description and the following detailed description are exemplary and explanatory only and are not restrictive of the invention, as claimed.

DETAILED DESCRIPTION

Figure 1:
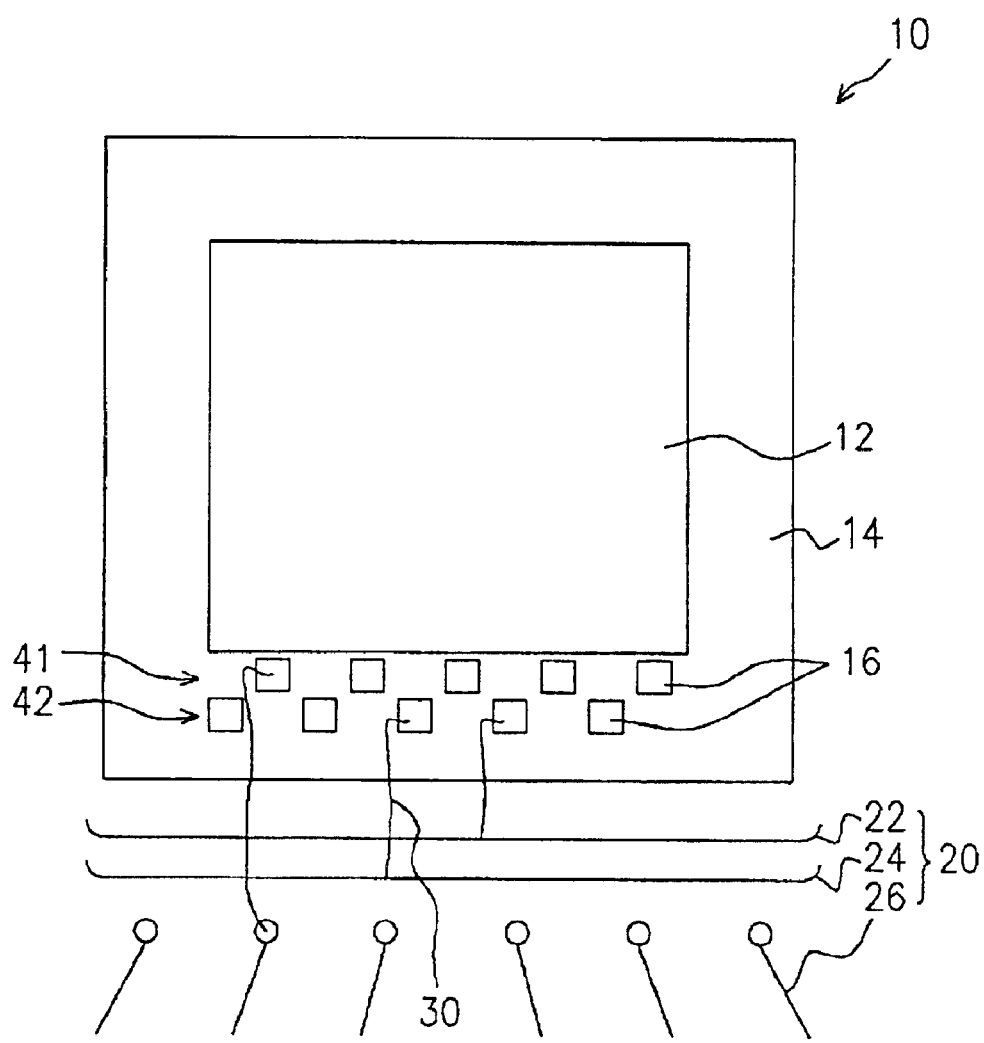
FIG. 1 shows a top view of a chip and a part of a carrier.
Figure 2:
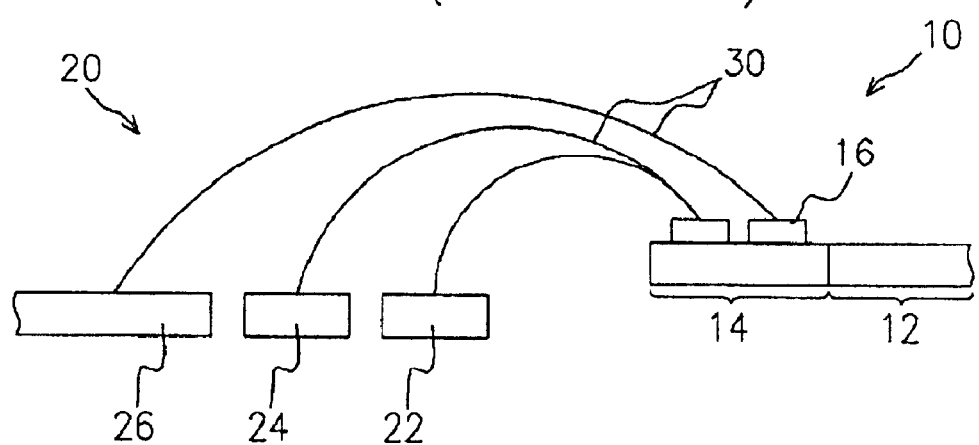
FIG. 2 shows a side view of the chip and the part of the carrier.
Figure 3:
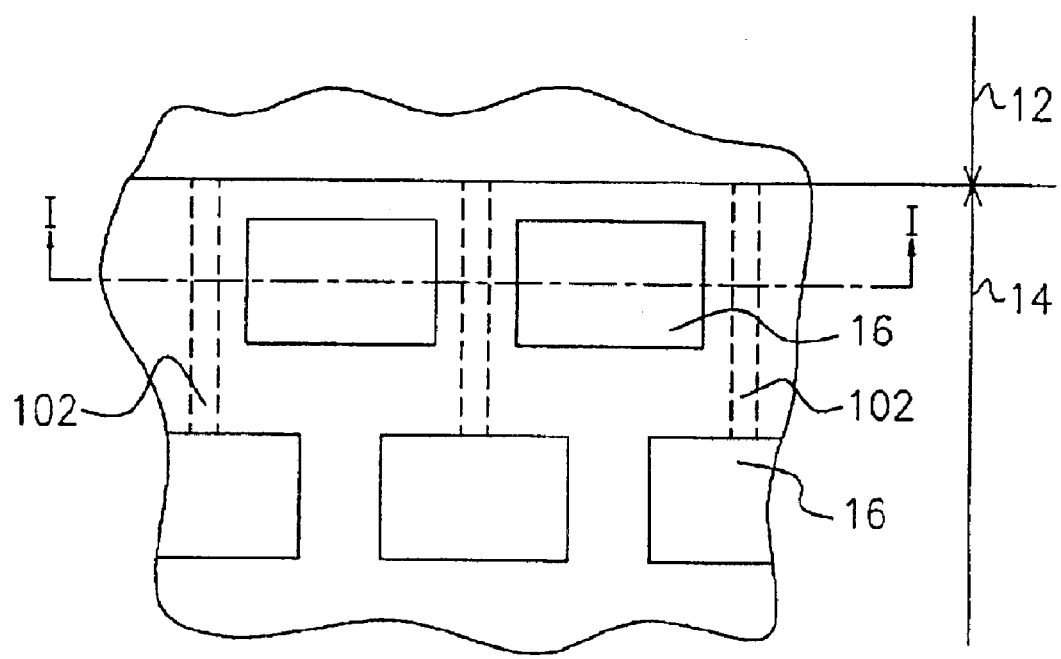
FIG. 3 shows a boundary between the core circuit and the bonding pad area of the chip enlarged according to a real proportion.
Figure 4:
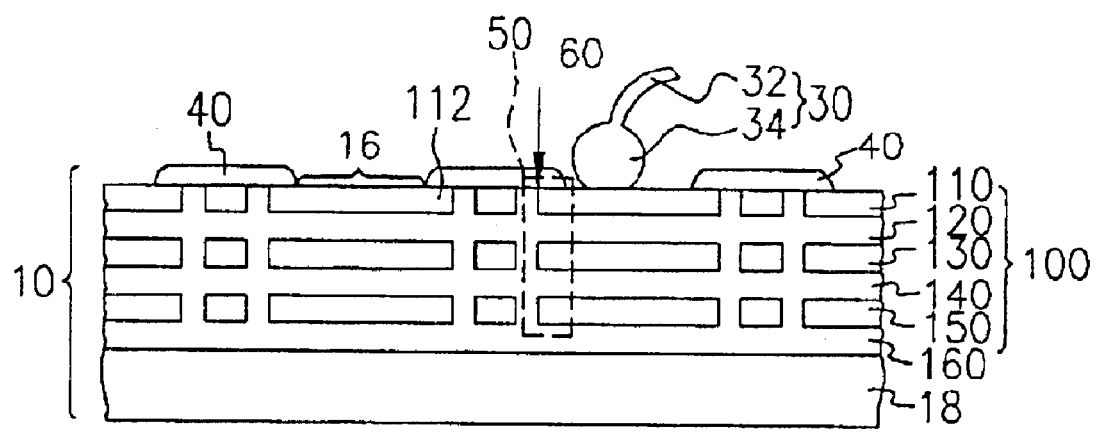
FIG. 4 is a cross-sectional view cutting along the line I—I of FIG. 3.
Figure 5:
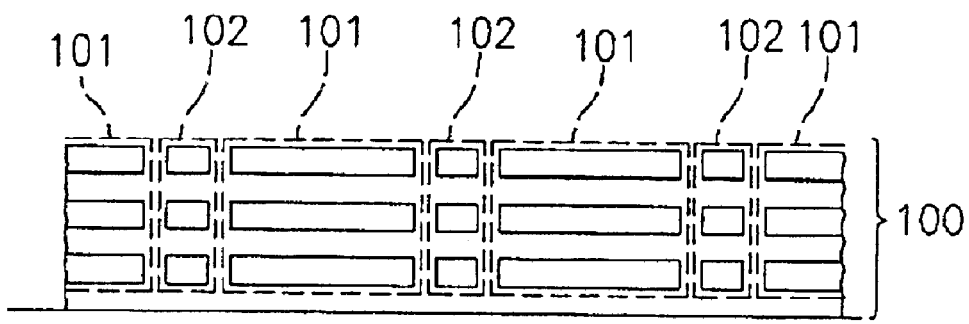
FIG. 5 is a simplified drawing of FIG. 4.
Figure 6:
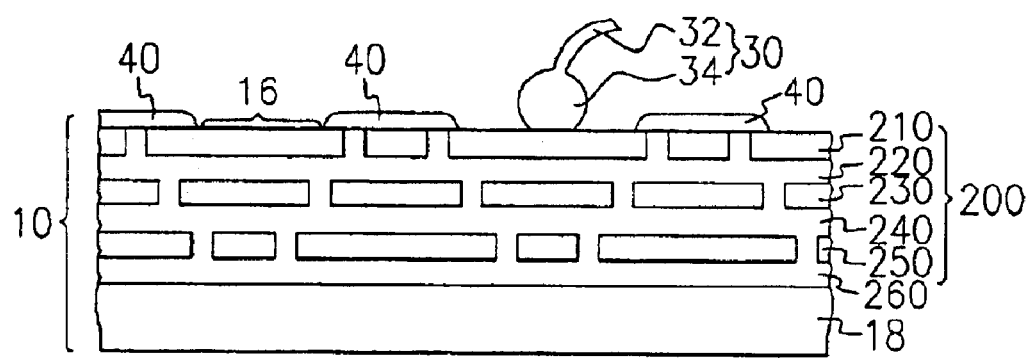
FIG. 6 shows the cross-sectional structure of a conductive wiring layer structure cutting along the line I—I of FIG. 3 according to the invention.

Referring to FIG. 6, a cross-sectional view of a conductive wiring layer structure provided by the invention is illustrated. The cross-sectional view is taken along the line I—I as shown in FIG. 3. The chip 10 comprises a substrate 18. The conductive wiring structure 200 located on the substrate 18 comprises three conductive wiring layers 210, 230 and 250 and three dielectric layers 220, 240 and 260 alternately overlaying each other. The material of the conductive wiring layers 210, 230 and 250 comprises copper, nickel, silver, palladium, palladium-nickel alloy, gold, titanium, titanium oxide, or a combination thereof. Three conductive wiring layers are used as an example of a plurality of conductive wiring layers. It is appreciated that different number of conductive wiring layers is also within the scope of the invention. An insulation layer 40 is formed on the uppermost conductive wiring layer 210. A part of the insulation layer 40 is removed to form an opening (the bonding pad 16) to provide the contact for an external electric connection of the chip 10. The bonding pad 16 is electrically connected to the circuit devices in the core circuit 10 of the chip via the conductive wiring layers 210, 230 and 250. During the wire bonding process, a wire bonding machine bonds the bonding wire 30 on the bonding pad 16 of the chip 10 to form a gold ball 34 and to pull out a gold wire 32. The bonding wire 30 is connected to the ring or finger contact (not shown) by other means. The surface area of the bonding pad 16 is larger than the diameter of the gold ball 34 to avoid the contact between the gold ball 34 and the insulation layer 40.

In the invention, the conductive wiring layer structure comprises a trapezium like structure. Therefore, the breakage or fracture on the vertical surface of the dielectric layers 120, 140 and 160 pointed by the arrow 60 is avoided, so that the abnormal contacts are prevented.

Figure 7:
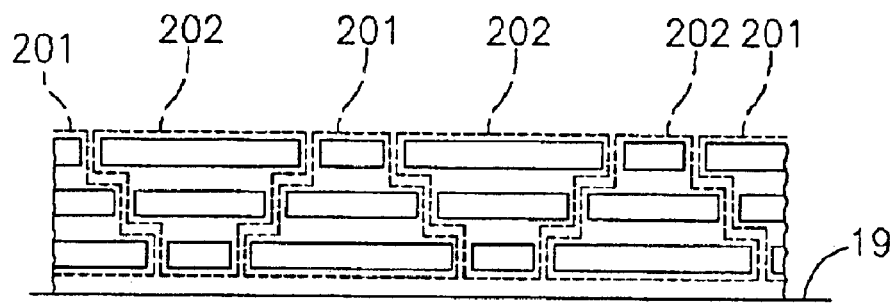
FIG. 7 is a simplified drawing of FIG. 6.

Referring to FIG. 7, which is a simplified drawing of FIG. 6, only a part of the conductive wiring layer structure 200 is illustrated. With the alternate arrangement of the upper-wide-and-lower-narrow conductive wiring layers and the upper-narrow-and-lower-wide conductive wiring layers, the conductive wiring layer structure is divided into the trapezium conductive wiring region 201 and the inverse trapezium conductive wiring region 202. The substrate surface 19 represents a surface of the substrate 18. For the trapezium conductive wiring region 201, the conductive wiring layers are gradually wider towards the substrate surface 19, and gradually narrower away from the substrate surface 19. On the contrary, in the inverse trapezium conductive wiring region 202, the conductive wiring layers are gradually narrower towards the substrate surface 19, and gradually wider away from the substrate surface 19. Vias can be formed along the vertical direction to conduct the conductive wiring layers. The material to form the vias includes tungsten, titanium, tantalum, platinum and molybdenum.

Further referring to FIG. 7, assume that the width of conductive wires of the trapezium conductive wiring region 201 is 20 units, 40 units and 80 units from the top to the bottom. If the total required width is 100 units, a total width of 140 units is obtained from these three conductive wiring layers. Similarly, a similar effect can be obtained for the inverse trapezium conductive wiring region 202. Therefore, the conductive wiring layer structure provided by the invention provides a larger total width of the conductive wire of the trapezium and inverse trapezium conductive wiring regions 201 and 202 for the outer bonding pads. Thus, the problem of insufficient effective width of conductive wires for the outer bonding pads is resolved.

According to the above, the conductive wiring layer structure of the invention provides the following advantages.

(1) The alternately arranged trapezium and inverse trapezium conductive wiring structure provides a reinforced structure of the conductive wiring layers and the dielectric layers. Therefore, the dielectric layers are not easily broken or damaged, so that the breakage or fracture caused by the impact of wire bonding is avoided. The yield of package is enhanced.

(2) The alternate trapezium and inverse trapezium conductive wiring structure provides a wider conductive wire, so that a larger cross section of the conductive wire for external electric connection is obtained to accommodate a larger current.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A conductive wiring layer structure, applied to a chip comprising a substrate, on which a core circuit and a bonding pad area are formed, whereon an insulation layer with a plurality of openings is formed to cover the core circuit and the bonding pad area, the conductive wiring layer structure comprising:

a plurality of first conductive wiring regions, located in the bonding pad area, wherein each of the first conductive wiring regions comprises a plurality of first dielectric layers and a plurality of patterned first conductive wiring layers alternately overlaying each other, and the first conductive wiring layers are gradually wider approaching the substrate, and gradually narrower away from the substrate; and a plurality of second conductive wiring regions, alternately arranged in the bonding pad area with the first conductive wiring regions, wherein each of the second conductive wiring regions comprises a plurality of second dielectric layers and a plurality of patterned second conductive wiring layers alternately overlaying each other, and the second conductive wiring layers are gradually narrower approaching the substrate, and gradually wider away from the substrate.

2. The structure according to claim 1, wherein a bonding pad is formed on an uppermost layer of the first conductive wiring layers.

3. The structure according to claim 1, wherein a via is formed to electrically connect the first conductive wiring layers.

4. The structure according to claim 3, wherein via is made of a material from any of tungsten, titanium, tantalum, platinum and molybdenum.

5. The structure according to claim 1, wherein a via is formed to electrically connect the second conductive wiring layers.

6. The structure according to claim 5, wherein via is made of a material from any of tungsten, titanium, tantalum, platinum and molybdenum.

7. The structure according to claim 1, wherein the first conductive wiring layers are made of a material selected from a group consisting of copper, nickel, silver, palladium, palladium nickel alloy, gold, titanium, titanium oxide and a combination of thereof.

8. The structure according to claim 1, wherein the second conductive wiring layers are made of a material selected from a group consisting of copper, nickel, silver, palladium, palladium nickel alloy, gold, titanium, titanium oxide and a combination of thereof.

* * * * *